(12) United States Patent
Tan et al.

(10) Patent No.: US 11,670,375 B2
(45) Date of Patent: *Jun. 6, 2023

(54) MEMORY WITH IMPROVED CROSS TEMPERATURE RELIABILITY AND READ PERFORMANCE

(71) Applicant: Micron Technology, Inc., Boise, ID (US)

(72) Inventors: Hua Tan, Shanghai (CN); Jingxun Eric Wu, Singapore (SG); Yingying Zhu, Shanghai (CN); Hui Yang, Shanghai (CN); Bo Zhou, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/458,211

(22) Filed: Aug. 26, 2021

(65) Prior Publication Data

US 2021/0391013 A1 Dec. 16, 2021

Related U.S. Application Data

(63) Continuation of application No. 16/484,881, filed as application No. PCT/CN2018/124807 on Dec. 28, 2018, now Pat. No. 11,107,533.

(51) Int. Cl.
*G11C 16/04* (2006.01)
*G11C 16/10* (2006.01)
(Continued)

(52) U.S. Cl.
CPC .......... *G11C 16/10* (2013.01); *G06F 3/0604* (2013.01); *G06F 3/0659* (2013.01);
(Continued)

(58) Field of Classification Search
CPC ..... G11C 16/10; G11C 16/0483; G11C 16/26; G06F 3/0679; G06F 3/0604; G06F 3/0659
(Continued)

(56) References Cited

U.S. PATENT DOCUMENTS

| 7,974,146 B2 * | 7/2011 | Barkley | G11C 16/30 365/230.06 |
| 8,611,157 B2 * | 12/2013 | Dutta | G11C 16/26 365/185.24 |

(Continued)

FOREIGN PATENT DOCUMENTS

| CN | 1892904 A | 1/2007 |
| CN | 101796589 | 8/2010 |

(Continued)

OTHER PUBLICATIONS

"Chinese Application Serial No. 201880100659.0, Office Action dated Jan. 5, 2022", w English translation, 9 pgs.

(Continued)

*Primary Examiner* — Tha-O H Bui
(74) *Attorney, Agent, or Firm* — Schwegman Lundberg & Woessner, P.A.

(57) ABSTRACT

A memory device provides a memory array including memory cells, a temperature sensing circuit, and a memory control unit operatively coupled to the memory array. The memory control unit includes a processor. The processor is configured to receive temperature information from the temperature sensing circuit, initiate programming of the memory cells with data using a first threshold voltage distribution when the temperature information indicates an operating temperature is in a first temperature range, and initiate programming of the memory cells with data using a second threshold voltage distribution when the temperature (Continued)

information indicates the operating temperature is in a second temperature range.

20 Claims, 7 Drawing Sheets

(51) Int. Cl.
G06F 3/06 (2006.01)
G11C 16/26 (2006.01)
G11C 16/06 (2006.01)
G11C 29/10 (2006.01)
G11C 29/50 (2006.01)

(52) U.S. Cl.
CPC ........ *G06F 3/0679* (2013.01); *G11C 16/0483* (2013.01); *G11C 16/06* (2013.01); *G11C 16/26* (2013.01); *G11C 29/10* (2013.01); *G11C 29/50* (2013.01)

(58) Field of Classification Search
USPC .................................................. 365/185.18
See application file for complete search history.

(56) References Cited

U.S. PATENT DOCUMENTS

| | | | |
|---|---|---|---|
| RE45,700 E | 9/2015 | Dutta | |
| 9,368,212 B1 | 6/2016 | Pan et al. | |
| 10,026,483 B1 | 7/2018 | Shah et al. | |
| 10,395,728 B2 | 8/2019 | Wu et al. | |
| 11,107,533 B2 | 8/2021 | Tan et al. | |
| 2009/0310408 A1* | 12/2009 | Lee .................. | G11C 16/0483 365/185.09 |
| 2011/0007566 A1 | 1/2011 | Roohparvar et al. | |
| 2012/0163092 A1 | 6/2012 | Jung et al. | |
| 2013/0163342 A1 | 6/2013 | Dutta | |
| 2020/0219568 A1 | 7/2020 | Tan et al. | |

FOREIGN PATENT DOCUMENTS

| | | |
|---|---|---|
| CN | 102682841 | 9/2012 |
| CN | 113366571 | 9/2021 |
| CN | 113366571 B | 8/2022 |
| KR | 20140033255 | 3/2014 |
| KR | 20150022012 | 3/2015 |
| KR | 20160033147 | 3/2016 |
| TW | 202042231 | 11/2020 |
| WO | WO-2020133199 A1 | 7/2020 |

OTHER PUBLICATIONS

"European Application Serial No. 18944969.7, Response Filed Feb. 23, 2022 to Communication Pursuant to Rules 161 (2) and 162 EPC mailed Oct. 6, 2021", W Claims, 11 pgs.
"International Appiication Serial No. PCT/CN2018/124807, International Preliminary Report on Patentability dated Jul. 8, 2021", 6 pgs.
"International Application Serial No. PCT/CN2018/124807, International Search Report dated Oct. 8, 2019", 4 pgs.
"International Application Serial No. PCT/CN2018/124807, Written Opinion dated Oct. 8, 2019", 4 pgs.
"Taiwanese Application Serial No. 108148449, Decision of Rejection dated Feb. 4, 2021", w/English Translation, 16 pgs.
"Taiwanese Application Serial No. 108148449, Office Action dated Sep. 1, 2020", w/ English Translation, 15 pgs.
"Taiwanese Application Serial No. 108148449, Response filed Mar. 31, 2021 to Decision of Rejection dated Feb. 4, 2021", 6 pgs.
"Taiwanese Application Serial No. 108148449, Response filed Dec. 10, 2020 to Office Action dated Sep. 1, 2020", w/ English Claims, 39 pgs.
"Korean Application Serial No. 10-2021-7024051, Response filed Jul. 18, 2022 to Notice of Preliminary Rejection dated May 18, 2022", w/ English Claims, 25 pgs.
"Taiwanese Application Serial No. 108148449, Response filed Sep. 29, 2022 to Office Action dated Jun. 28, 2022", w/ English Claims, 42 pgs.
"Chinese Application Serial No. 201880100659.0, Response Filed Apr. 20, 2022 to Office Action dated Jan. 5, 2022", W English Claims, 19 pgs.
"Korean Application Serial No. 10-2021-7024051, Notice of Preliminary Rejection dated May 18, 2022", W English Translation, 14 pgs.
"Taiwanese Application Serial No. 108148449, Office Action dated Jun. 28, 2022", W English Translation, 30 pgs.
"European Application Serial No. 18944969.7, Extended European Search Report dated Jul. 27, 2022", 10 pgs.
"Korean Application Serial No. 10-2021-7024051, Notice of Preliminary Rejection dated Oct. 11, 2022", with English translation, 13 pages.

* cited by examiner

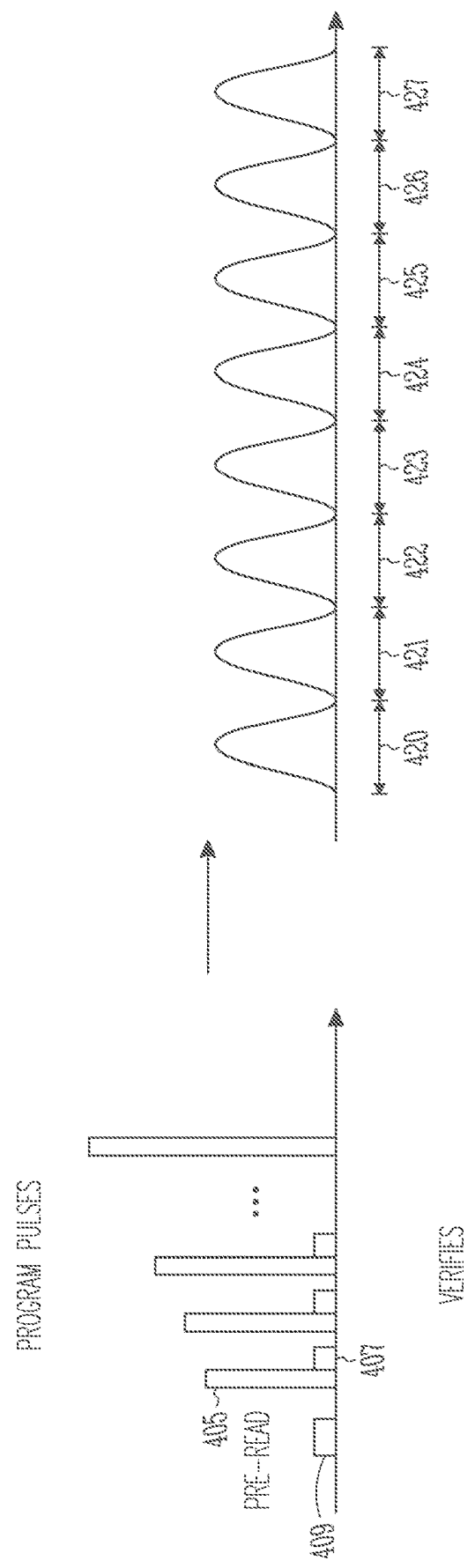

MEMORY WITH IMPROVED CROSS TEMPERATURE RELIABILITY AND READ PERFORMANCE

PRIORITY APPLICATION

This application is a continuation of U.S. application Ser. No. 16/484,881 filed Aug. 9, 2019, which is a U.S. National Stage Application under 35 U.S.C. 371 from International Application No. PCT/CN2018/124807, filed Dec. 28, 2018, published as WO 2020/133199, all of which are incorporated herein by reference in their entirety.

BACKGROUND

Memory devices are typically provided as internal, semiconductor, integrated circuits in computers or other electronic devices. There are many different types of memory including volatile and non-volatile memory. Volatile memory can require power to maintain data and includes random-access memory (RAM), dynamic random-access memory (DRAM), and synchronous dynamic random-access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random-access memory (RRAM), and magnetoresistive random access memory (MRAM), 3D XPoint™ memory, among others.

Memory cells are typically arranged in a matrix or an array. Multiple matrices or arrays can be combined into a memory device, and multiple devices can be combined to form a storage volume of a memory system, such as a solid-state drive (SSD), a Universal Flash Storage (UFS™) device, a MultiMediaCard (MMC) solid-state storage device, an embedded MMC device (eMMC™), etc.

A memory system can include one or more processors or other memory controllers performing logic functions to operate the memory devices or interface with external systems. The memory matrices or arrays can include a number of blocks of memory cells organized into a number of physical pages. The memory system can receive commands from a host in association with memory operations, such as read or write operations to transfer data (e.g., user data and associated integrity data, such as error data and address data, etc.) between the memory devices and the host, erase operations to erase data from the memory devices, or perform one or more other memory operations.

Memory is utilized as volatile and non-volatile data storage for a wide range of electronic applications, including, for example, personal computers, portable memory sticks, digital cameras, cellular telephones, portable music players such as MP3 players, movie players, and other electronic devices. Memory cells can be arranged into arrays, with the arrays being used in memory devices.

Many electronic devices include several main components: a host processor (e.g., a central processing unit (CPU) or other main processor); main memory (e.g., one or more volatile or non-volatile memory device, such as dynamic RAM (DRAM), static RAM (SRAM), mobile or low-power double-data-rate synchronous DRAM (DDR SDRAM), etc.); and a storage device (e.g., non-volatile memory (NVM) device, such as flash memory, read-only memory (ROM), an SSD, an MMC, or other memory card structure or assembly, or combination of volatile and non-volatile memory, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 4 is an illustration of a programming pass of a memory programming algorithm performed by a memory control unit.

DETAILED DESCRIPTION

Memory devices, particularly NVM devices, such as NAND flash devices, etc., can include arrays of multi-level memory cells. To program multi-level memory cells, a memory page buffer is stored with the value to be written to the memory cells. A first programming pulse is applied to the control gate of the memory cell at a voltage level that should not cause the threshold voltage of the memory cell to exceed the lowest threshold voltage of a target programmed data state of a multi-level memory cell. A read operation can then be performed to verify the threshold level to which the cell is programmed. If the cell is not programmed to the desired threshold voltage, an additional programming pulse, including optionally a higher voltage or longer length pulse, is applied and the threshold voltage is rechecked. This process is repeated until the read operation confirms that the memory cell is programmed to the desired threshold voltage.

Figure 1:
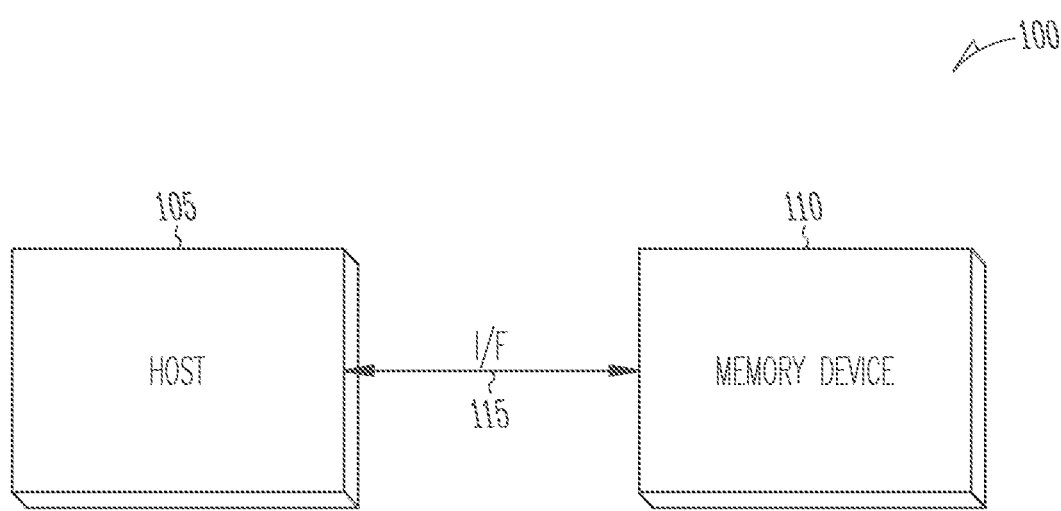
FIG. 1 illustrates an example system including a host and a memory device.

FIG. 1 illustrates an example system 100 including a host 105 and a memory device 110. The host 105 can include a host processor, a central processing unit, or one or more other device, processor, or controller. The memory device 110 can include a universal flash storage (UFS) device, an embedded MMC (eMMC™) device, or one or more other memory devices. The host 105 and the memory device 110 can communicate using a communication interface (I/F) 115 (e.g., a bidirectional parallel or serial communication interface).

In an example, the memory device 110 can include a UFS device, and the communication interface 115 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, the memory device 110 can include an eMMC™ device, and the communication interface 115 can include a number of parallel bidirectional data lines (e.g., DAT[7:0]) and one or more command lines, such as defined in one or more JEDEC standards (e.g. JEDEC standard D84-B51 (JESD84-A51), commonly referred to as JEDEC eMMC standard 5.1, etc.). In other examples, the memory device 110 can include one or more other memory devices, or the communication interface 115 can include one or more other interfaces, depending on the host 105 and the memory device 110. The identified standards are provided only as example environments in which the described methods and structures may be utilized; but such methods and structures may be utilized in a variety of environments outside of the identified standards (or of any actual or proposed standards).

Each of the host 105 and the memory device 110 can include a number of receiver or driver circuits configured to send or receive signals over the communication interface 115, or interface circuits, such as data control units, sampling circuits, or other intermedia circuits configured to process data to be communicated over, or otherwise process data received from the communication interface 115 for use by the host 105, the memory device 110, or one or more other circuits or devices.

The memory device 110 can include a memory array (e.g., one or more arrays of memory cells, such as a NAND flash memory array, or one or more other memory arrays), a memory control unit, and in certain examples, an interface circuit between the memory array and the memory control unit. In certain examples, the memory array can include a number of memory die, each having control logic separate from the memory control unit. The memory control unit can include an application specific integrated circuit (ASIC), a field programmable gate array (FPGA), or one or more other processing circuits arranged or programmed to manage data transfers or operations to, from, or within the memory array.

Figure 2:
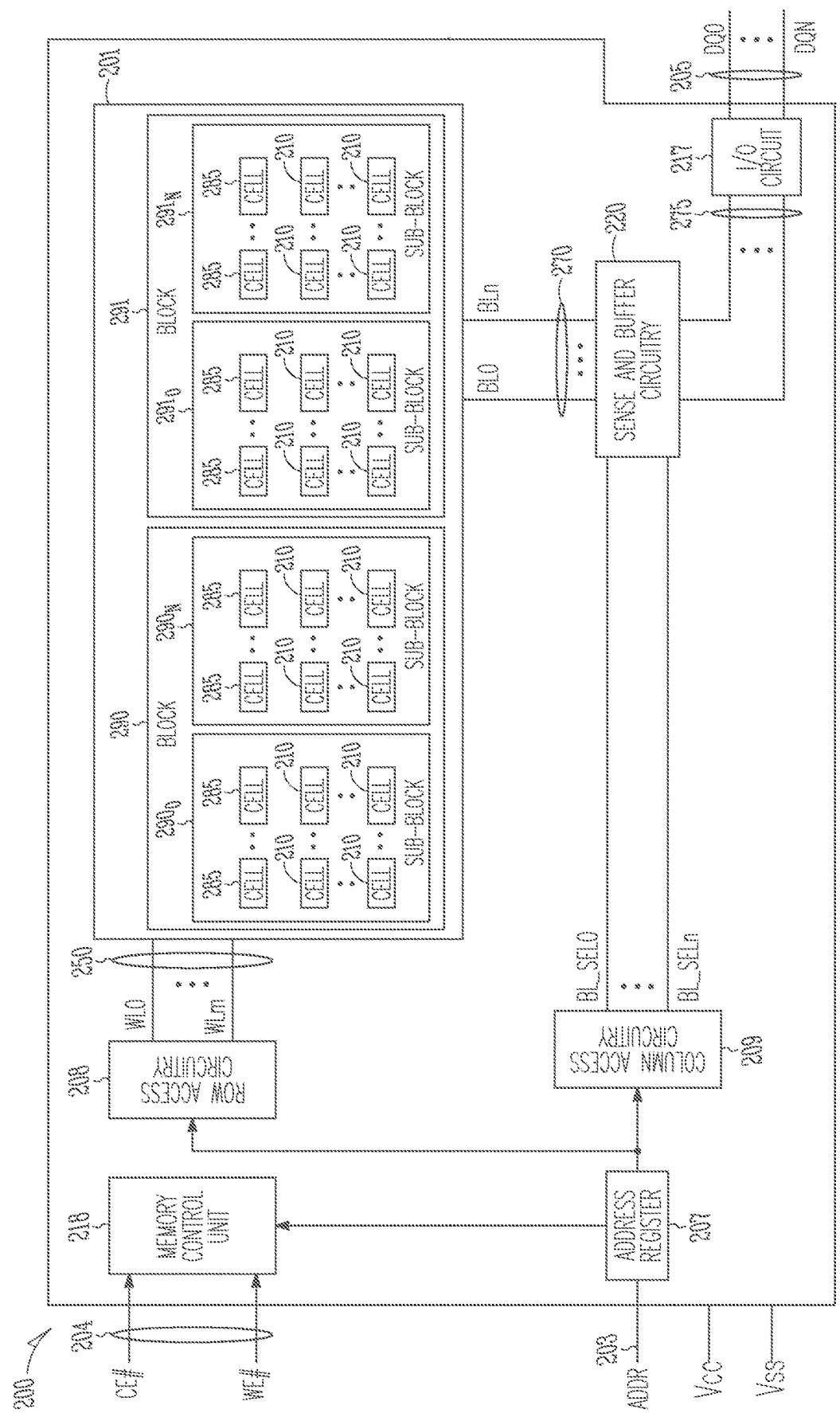
FIG. 2 is a block diagram of an apparatus in the form of a memory device including non-volatile memory cells.

FIG. 2 shows a block diagram of an apparatus in the form of a memory device 200 (e.g., memory device 110 in FIG. 1) including non-volatile memory cells having mixed memory cell types integrated in the same integrated circuit (IC) chip, according to some examples described herein. Memory device 200 can include a memory array (or multiple memory arrays) 201 containing memory cells 210 and 285. In the physical structure of memory device 200, memory cells 210 and 285 can be arranged vertically (e.g., stacked over each other) over a substrate of memory device 200 (e.g., a semiconductor substrate of an IC chip that includes memory device 200). Memory cells 210 and 285 can include non-volatile cells. Memory cells 210 and 285 can have different non-volatile memory cell types. For example, memory cells 210 can include floating gate memory cells, charge trap memory cells, or other types of non-volatile memory cells. Memory cells 285 can include ferroelectric memory cells, phase change memory cells, resistive memory cells, conduction bridge memory cells, and spin-transfer-torque magnetic random access memory (STT-MRAM) cells, or other types of non-volatile memory cells.

As shown in FIG. 2, memory cells 210 and 285 can be arranged in blocks (memory cell blocks), such as blocks 290 and 291. Each of blocks 290 and 291 can include sub-blocks. For example, block 290 can include sub-blocks $290_0$ and $290_n$, and block 291 can include sub-blocks $291_0$ and $291_n$. Each of sub-blocks $290_0$, $290_n$, $291_0$, and $291_n$ can include a combination of memory cells 210 and 285. FIG. 2 shows memory device 200 having two blocks 290 and 291 and two sub-blocks in each of the blocks as an example. Memory device 200 can have more than two blocks and more than two sub-blocks in each of the blocks.

As shown in FIG. 2, memory device 200 can include access lines (which can include word lines) 250 and data lines (which can include bit lines) 270. Access lines 250 can carry signals (e.g., word line signals) WL0 through WLm. Data lines 270 can carry signals (e.g., bit line signals) BL0 through BLn. Memory device 200 can use access lines 250 to selectively access sub-blocks $290_0$, $290_n$, $291_0$, and $291_n$ of blocks 290 and 291 and data lines 270 to selectively exchange information (e.g., data) with memory cells 210 of blocks 290 and 291.

Memory device 200 can include an address register 207 to receive address information (e.g., address signals) ADDR on lines (e.g., address lines) 203. Memory device 200 can include row access circuitry 208 and column access circuitry 209 that can decode address information from address register 207. Based on decoded address information, memory device 200 can determine which memory cells 210 of which sub-blocks of blocks 290 and 291 are to be accessed during a memory operation. Memory device 200 can perform a read operation to read (e.g., sense) information (e.g., previously stored information) in memory cells 210, or a write (e.g., program) operation to store (e.g., program) information in memory cells 210. Memory device 200 can use data lines 270 associated with signals BL0 through BLn to provide information to be stored in memory cells 210 or obtain information read (e.g., sensed) from memory cells 210. Memory device 200 can also perform an erase operation to erase information from some or all of memory cells 210 of blocks 290 and 291.

Memory device 200 can include a memory control unit 218 (which can include components such as a state machine (e.g., finite state machine), register circuits, and other components) configured to control memory operations (e.g., read, write, and erase operations) of memory device 200 based on control signals on lines 204. Examples of the control signals on lines 204 include one or more clock signals and other signals (e.g., a chip enable signal CE#, a write enable signal WE#) to indicate which operation (e.g., read, write, or erase operation) memory device 200 can perform.

Memory device 200 can include sense and buffer circuitry 220 that can include components such as sense amplifiers and page buffer circuits (e.g., data latches). Sense and buffer circuitry 220 can respond to signals BL_SEL0 through BL_SELn from column access circuitry 209. Sense and buffer circuitry 220 can be configured to determine (e.g., by sensing) the value of information read from memory cells 210 (e.g., during a read operation) of blocks 290 and 291 and provide the value of the information to lines (e.g., global data lines) 275. Sense and buffer circuitry 220 can also can be configured to use signals on lines 275 to determine the value of information to be stored (e.g., programmed) in memory cells 210 of blocks 290 and 291 (e.g., during a write operation) based on the values (e.g., voltage values) of signals on lines 275 (e.g., during a write operation).

Memory device 200 can include input/output (I/O) circuitry 217 to exchange information between memory cells 210 of blocks 290 and 291 and lines (e.g., I/O lines) 205. Signals DQ0 through DQN on lines 205 can represent information read from or stored in memory cells 210 of blocks 290 and 291. Lines 205 can include nodes within memory device 200 or pins (or solder balls) on a package where memory device 200 can reside. Other devices external to memory device 200 (e.g., a memory controller, memory control unit, or a processor) can communicate with memory device 200 through lines 203, 204, and 205.

Memory device 200 can receive a supply voltage, including supply voltages Vcc and Vss. Supply voltage Vss can operate at a ground potential (e.g., having a value of approximately zero volts). Supply voltage Vcc can include an external voltage supplied to memory device 200 from an external power source such as a battery or alternating current to direct current (AC-DC) converter circuitry.

Each of memory cells 210 can be programmed individually or collectively to one or a number of programmed states. For example, a single-level cell (SLC) can represent one of two programmed states (e.g., 1 or 0), representing one bit of data. However, flash memory cells can also represent one of more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell that can store more than one bit of data per cell (i.e., that can represent more than two programmed states).

In another example, each of memory cells 210 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multilevel cell (or multi-state cell).

Memory device 200 can include a non-volatile memory device, such that memory cells 210 and 285 can retain information stored thereon when power (e.g., voltage Vcc, Vss, or both) is disconnected from memory device 200. For example, memory device 200 can be a flash memory device, such as a NAND flash (e.g., 3-dimensional (3-D) NAND) or a NOR flash memory device, or another kind of memory device, such as a variable resistance memory device (e.g., a phase change memory device or a resistive RAM (Random Access Memory) device). One of ordinary skill in the art may recognize that memory device 200 may include other components not shown in FIG. 2 so as not to obscure the example embodiments described herein.

In memory device 200, memory cells 210 can be configured to store information (e.g., user data). Memory cells 285 may not be configured to permanently store information such as user information, but they may be used by memory device 200 as temporary storage cells during an operation (e.g., a write operation) of storing information (e.g., user data) in memory cells 210 in order to improve operations of memory device 200.

Figures 3A, 3B:
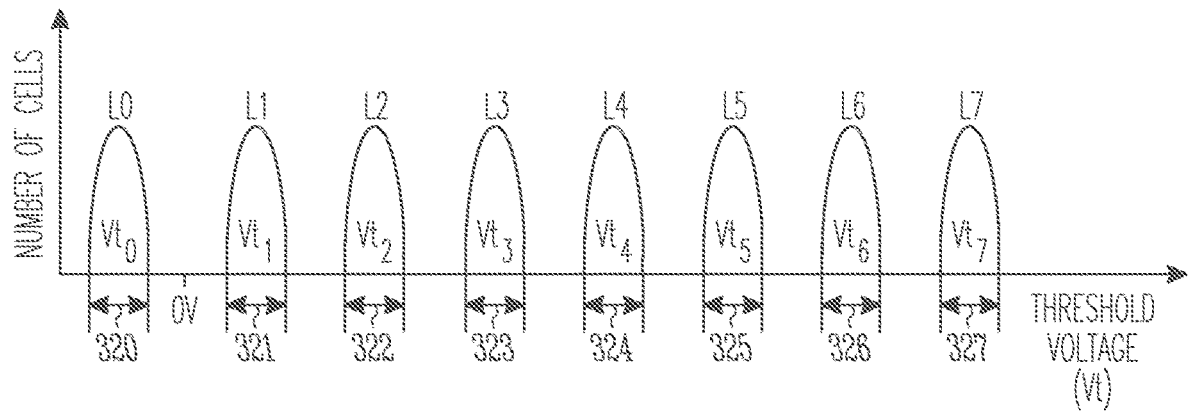
FIG. 3A is an illustration of an example of threshold voltage value distributions for memory cells.
FIG. 3B is an example chart showing threshold voltages and corresponding bit values.

FIG. 3A shows an example of threshold voltage value ranges 320 through 327 of corresponding threshold voltages $Vt_0$ through $Vt_7$ of memory cells 210 and 285 of memory device 200 of FIG. 2, according to some examples described herein. Each of memory cells 210 and 285 is configured to store more than one bit of information. FIG. 3A shows an example of threshold voltage value ranges 320 through 327 for memory cells configured to store three bits (e.g., bits B0, B1, and B2) of information. FIG. 3A shows eight levels (level 0 (L0) through level 7 (L7)) corresponding to eight different combinations of three bits. Level L0 can be called an erase level (e.g., erase state). Each of levels L0 through L7 has a threshold voltage value range for a large number of memory cells. Other numbers of bits and levels can be used in the programming (e.g., two bits for four levels, or four bits for sixteen levels).

Each of threshold voltages $Vt_0$ through $Vt_7$ has a value (analog voltage value) within a corresponding threshold voltage value range. For example, threshold voltage $Vt_1$ can be any value (a positive voltage value in volt unit) within threshold voltage value range 321, and threshold voltage $Vt_7$ can be any value (a positive voltage value in volt unit) within threshold voltage value range 327.

As shown in FIG. 3A, the values of threshold voltages $Vt_0$ through $Vt_7$ can go from a value within a lowest value range (threshold voltage value range 320 corresponding to level L0) to a value within a highest threshold voltage value range (threshold voltage value range 327 corresponding to level L7). Thus, the value of threshold voltage $Vt_7$ is greatest among the values of threshold voltages $Vt_0$ through $Vt_7$. The value of each of threshold voltage $Vt_0$ through $Vt_7$ can be used to represent a value (binary value) of a combination of three bits of information. L0 can be considered as an erase level.

FIG. 3B is an example chart (e.g., a table) showing threshold voltages $Vt_0$ through $Vt_7$ (eight different threshold voltages) and corresponding values (eight combinations of binary values) of three bits B0, B1, and B2 according to some examples described herein. For example, the values (e.g., in volt units) of threshold voltages $Vt_0$ through $Vt_7$ can be used to represent values (binary values) 000, 001, 010, 011, 100, 101, 110, and 111, respectively, of bits B0, B1, and B2. FIG. 3B shows the values of threshold voltages $Vt_0$ through $Vt_7$ being assigned to (e.g., mapped to) values (000 through 111) of bits B0, B1, and B2 in a sequential order (sequentially from a lower binary value to a higher binary value), as an example. However, the values of threshold voltages $Vt_0$ through $Vt_7$ can be assigned to values of bits B0, B1, and B2 in any order (e.g., non-sequential order). Based on the chart in FIG. 3B, during a write operation, the target value (analog value) for the threshold voltage of a selected memory cell (one of memory cells 210 and 285 in FIG. 2) is based on the value (binary value) of bits B0, B1, and B3 to be stored in that selected memory cell. For example, if three bits (B0, B1, and B2) having a value binary value of "100" are to be stored in the selected memory, then memory device 100 can cause (e.g., program) the threshold voltage of that selected memory cell to be the value of threshold voltage $Vt_4$ ("100"=$Vt_4$ based on the chart in FIG. 3B).

Returning to in FIG. 2, the memory control unit 218 may load a page of data to be programmed in the sense and buffer circuitry 220. The programming algorithm performed by the memory control unit 218 may begin with programming the memory cells to be written to L0 in an erase cycle. Memory cells can be written one memory page at a time or multiple memory pages at a time. Successive programming passes can be used to program the memory cells with data. The first pass may program all the bits to be programmed to L1 (or $Vt_1$). The programming, or placing, of all the L1 bits can be verified before moving on to the L2 bits. For memory cells for which programming to $Vt_1$ could not be verified, the memory controller may try to place an increased $Vt_1$ in these memory cells. This change in $Vt_1$ plus the variation in the memory cells can produce the threshold voltage range of $Vt_1$ shown in FIG. 3A. Programming or placement of the threshold voltage in the cells then progresses through placing the L2 through L7 threshold levels to complete programming the memory cells.

FIG. 4 is an illustration of a programming pass of a memory programming algorithm performed by the memory control unit to place eight voltage thresholds in multi-level memory cells. The user data in bits B2, B1, and B0 are used to program the memory cells to eight levels. The programming algorithm may include a Pre-Read operation 409. The eight levels 420 through 427 are placed using programming pulses 405 and verify operations 407.

Figure 5:
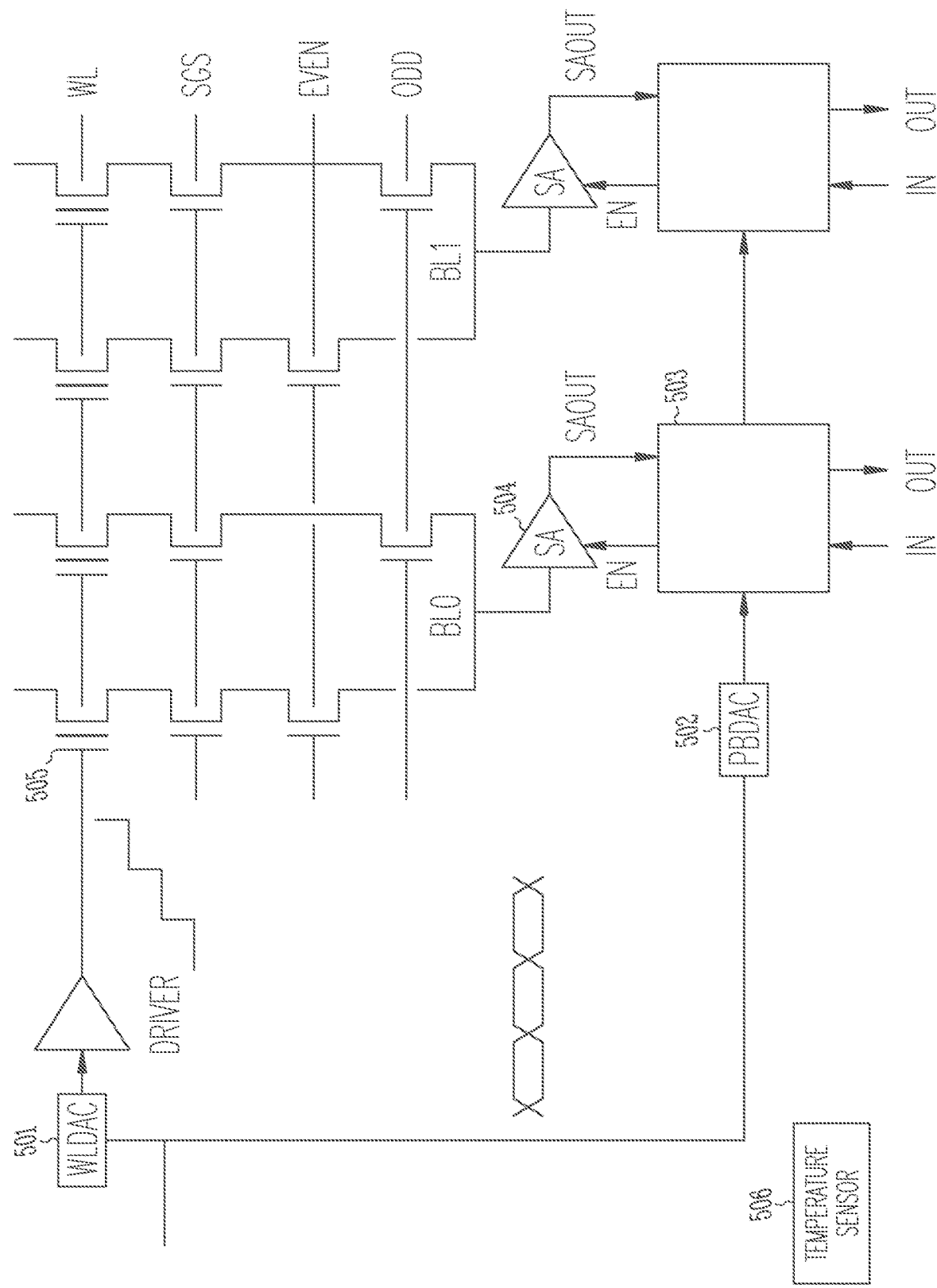
FIG. 5 is an illustration of an example of portions of flash memory device with a placeable threshold voltage.

FIG. 5 is an illustration of an example of portions of flash memory device with a placeable threshold voltage, consistent with some examples of the invention. Here, a word line DAC 501 receives a digital signal and converts it to an analog ramping voltage signal applied to the word line of a cell to be programmed. The word line voltage ramp is also fed to a page buffer DAC 502, which is connected to a page buffer 503. The page buffer is coupled to a sense amplifier designed to detect whether current is flowing in the NAND flash string, indicating that the threshold voltage for the flash memory cell 505 has been reached. The page buffer 503 stores the target threshold value of the cell 505 if being written or can be used to latch the observed threshold value of the flash memory cell 505 if being read or verified. A comparator compares the value stored in the page buffer 503 with the value received from the page buffer DAC 502, enabling the page buffer to read or write a data value to the flash memory cell 505.

One performance target for a memory system is consistent performance with high reliability across all operating conditions. This is especially true for sequential read operations. A sequential read is to sequential addresses and the operation returns a result with a larger chunk size (e.g., 128 kilobyte (KB) to 512 KB) than a random read operation to random addresses. One of the most challenging aspects of consistent performance is high reliability across the operating temperature range for the entire life of the memory system. For example, the desired operating temperature for the memory may be from −25 degrees Celsius (−25° C.) to +85° C. One of the causes for failure of a memory system is the shift in Vt distribution with temperature variation. For example, one or more of the Vt distributions (e.g., levels 420-427) of FIG. 4 may shift and cause overlap between distributions. This shift can result in loss of the read margins across the temperature operating range.

An approach to improve performance across temperature range is to improve the read margin based on a determined operating temperature of the memory device. The shift in Vt of a memory cell may be more likely to occur at the extremes of the operating temperature range. When it is detected that the operating temperature is an extreme temperature, the memory cells are programmed with a refined Vt distribution to improve the read margins.

Figure 6:
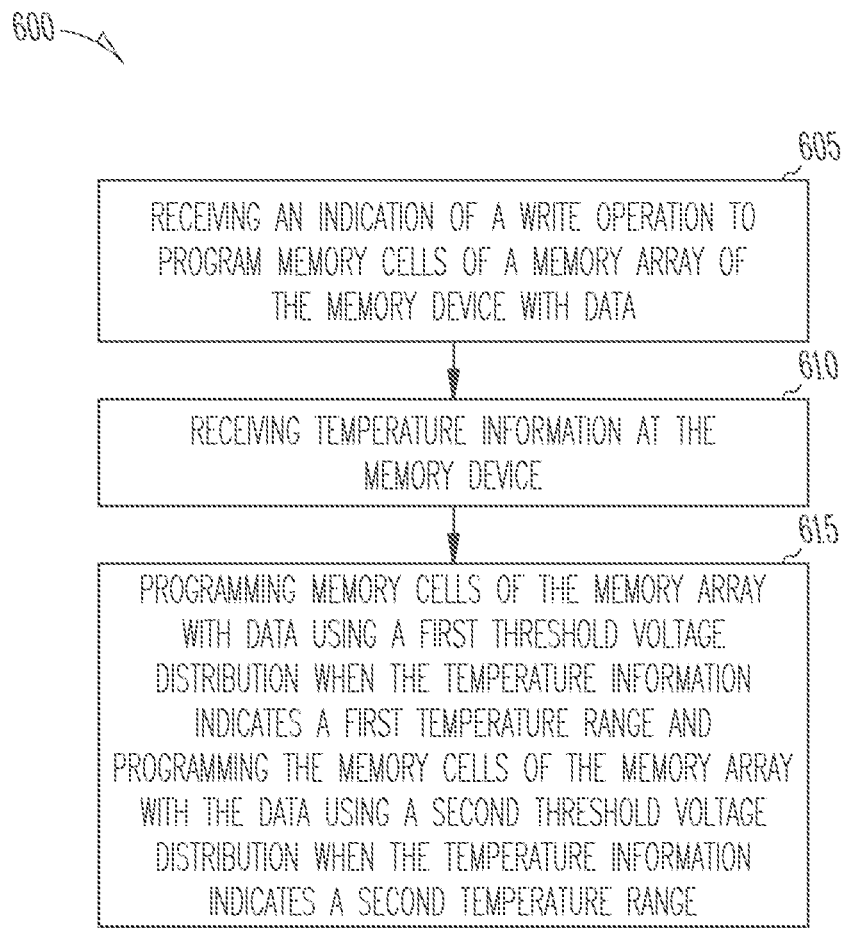
FIG. 6 is a flow diagram of an example of a method of operating a memory device.

FIG. 6 is a flow diagram of a method of operating a memory device. At 605, an indication is received (e.g., a memory command) of a write operation to program memory cells of a memory array of the memory device with data. At 610, temperature information is received by the memory device. In certain examples, the memory device receives the temperature information from a separate device. In certain examples, the memory device includes a temperature sensor and the memory device receives the temperature information from the temperature sensor.

At 615, the memory device programs the memory cells with data using a first threshold voltage distribution when the temperature information indicates a first temperature range, and programs the memory cells with the data using a second threshold voltage distribution when the temperature information indicates a second temperature range. The second threshold voltage distribution has improved read margins from the first threshold distribution. For example, in FIG. 5, the memory device can include a temperature sensing circuit 506 that outputs a voltage proportional to temperature over the range of −25° C. to +85° ° C. Based on the voltage output from the temperature sensing circuit, the memory control unit of the memory device initiates programming of the memory cells using the first or second threshold voltage distribution.

As explained above, the operating temperature may range over a lower temperature limit of $T_{COLD}$ (e.g., −25° C.) to an upper temperature limit of $T_{HOT}$ (e.g., +85° C.). Two intermediate temperatures can be defined $T_{COLD\_FINE}$ and $T_{HOT\_FINE}$, where $T_{COLD} < T_{COLD\_FINE} < T_{HOT\_FINE} < T_{HOT}$ (e.g., $T_{COLD\_FINE}$=−10° C., and $T_{HOT\_FINE}$=+50° C.). This defines three ranges of temperatures: a low range, a medium range, and a high range. When the operating temperature is in the medium range of $T_{COLD\_FINE}$-$T_{HOT\_FINE}$ the memory control unit initiates programming of the memory cells with the normal of default threshold voltage distribution. The low range ($T_{COLD}$-$T_{COLD\_FINE}$) and the high range ($T_{HOT\_FINE}$-$T_{HOT}$) can be used to define the more extreme operating conditions. When the operating temperature is in the low range or the high range, the memory control unit initiates programming using the second threshold voltage distribution.

Programming for the low range and the high range using the second threshold voltage distribution increases the read margins from the default programming using the first threshold distribution. To increase the read margins a finer trim is used for the programming algorithm. The finer trim programming algorithm can increase the number of voltage steps used to program the memory cells from the number of steps in the default trim used to program the first threshold voltage distribution.

Returning to FIG. 5, the output of DAC 501 can provide the voltage steps to program the memory cells. The finer trim algorithm can increase the number of steps used when programming the memory cells. For example, for the eight Vt example of FIG. 3, the default programming algorithm may use eight voltage steps when programming the memory cells. The finer trim programming algorithm may increase the number of steps to ten to fifteen voltage steps. This allows an unused voltage step to be between two or more of the eight Vts to increase the margins between adjacent programmed Vts. In some examples, the range of Vt from lowest to highest stays the same to meet the specifications of the memory cells (e.g., a NAND cell programming specification). To increase the number of steps used to program the memory cells, the size of the voltage steps output by the DAC may be decreased to include more steps in the same range of Vt.

Additionally, the finer trim algorithm may increase the number of the number of program pukes used to program the memory cells from the number used in the default programming algorithm. When increasing the number of pulses, $V_{BIAS}$ used in the programming may be decreased to decrease the hot electron effect of programming.

Programming the memory cells with the finer trim algorithm will result in a voltage distribution with increased margins between the Vts of the distribution. The increased margins will be more resistant to overlap in the temperature extremes. The tradeoff is that the finer trim algorithm may reduce the performance of the write operation slightly when the operating temperature is in the high and low ranges, but performance of read operations will improve.

Figure 7:
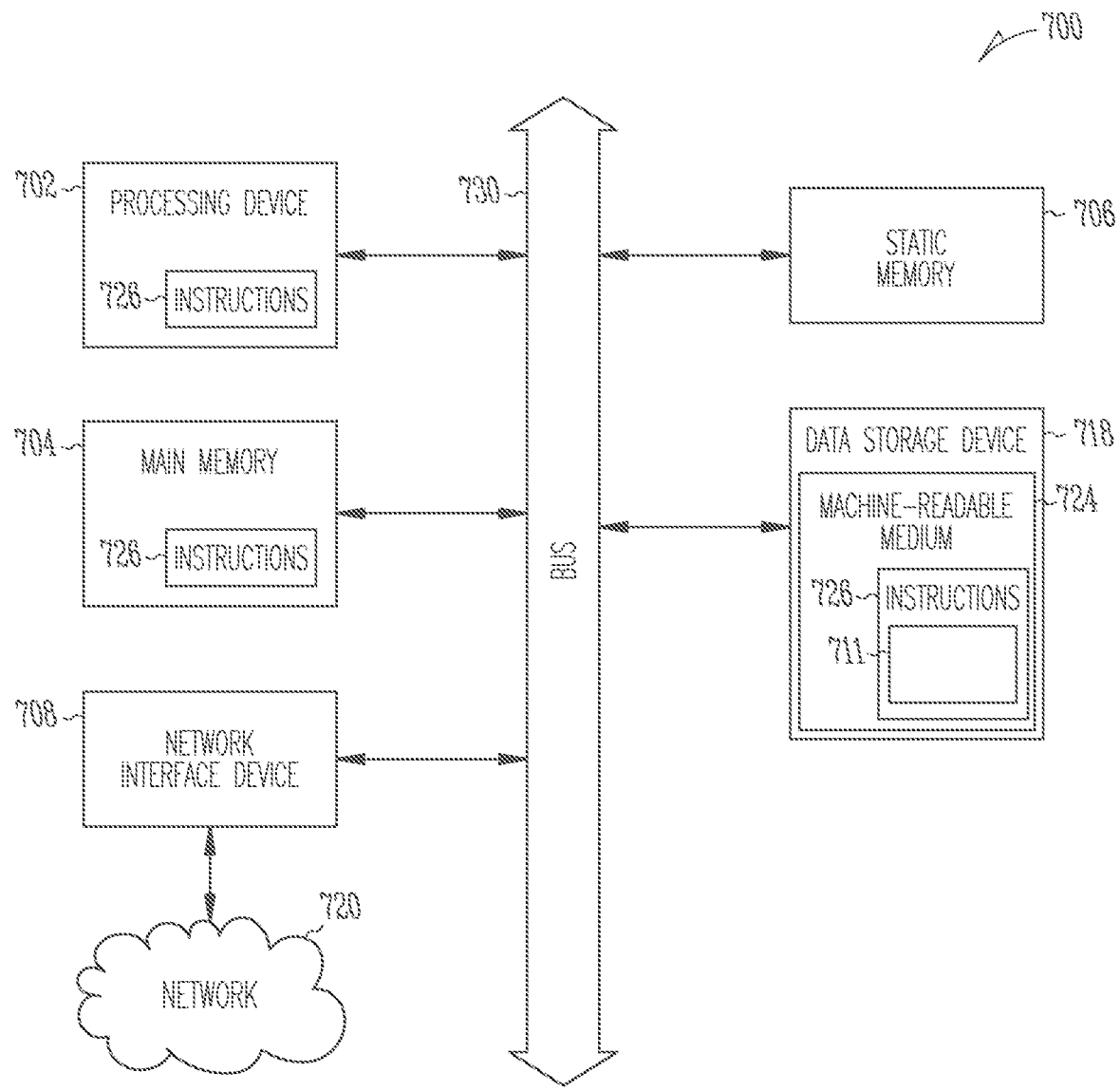
FIG. 7 illustrates a block diagram of an example machine according to some examples described herein.

FIG. 7 illustrates a block diagram of an example machine 700 upon which any one or more of the techniques (e.g., methodologies) discussed herein may perform, such as the described finer trim programming operations for extreme operating temperatures for example. In alternative examples, the machine 700 may operate as a standalone device or may be connected (e.g., networked) to other machines. In a networked deployment, the machine 700 may operate in the capacity of a server machine, a client machine, or both in server-client network environments. In an example, the machine 700 may act as a peer machine in peer-to-peer (P2P) (or other distributed) network environment. The machine 700 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

The embodiments and examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system) 700 (e.g., the host 105, the memory device 110 of FIG. 1, etc.) may include a processing device 702 (e.g., a hardware processor, a central processing unit (CPU), a graphics processing unit (GPU), a hardware processor core, or any combination thereof, such as a memory control unit of the memory device 110, etc.), a main memory 704 (e.g., read-only memory (ROM), flash memory, dynamic random-access memory (DRAM) such as synchronous DRAM (SDRAM) or Rambus DRAM (RDRAM), etc.), a static memory 706 (e.g., flash memory, static random-access memory (SRAM), etc.), and a data storage system 718, some or all of which may communicate with each other via an interlink (e.g., bus) 730.

The processing device 702 can represent one or more general-purpose processing devices such as a microprocessor, a central processing unit, or the like. More particularly, the processing device 702 can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), network processor, or the like. The processing device 702 can be configured to execute instructions 726 for performing the operations and steps discussed herein. The machine 700 can further include a network interface device 708 to communicate over a network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 or within the processing device 702 during execution thereof by the machine 700, the main memory 704 and the processing device 702 also constituting machine-readable storage media. The machine-readable storage medium 724, the data storage system 718, or the main memory 704 can correspond to the memory device 110 of FIG. 1. In one implementation, the instructions 726 include instructions 711 to implement functionality corresponding to a programming operation (e.g., the programming operation of FIG. 6).

While the machine-readable storage medium 724 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 700 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 700 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 726 (e.g., software, programs, an operating system (OS), etc.) or other data are stored on the data storage device 718 can be accessed by the main memory 704 for use by the processing device 702. The main memory 704 (e.g., DRAM) is typically fast, but volatile, and thus a different type of storage than the data storage device 718 (e.g., an SSD), which is suitable for long-term storage, including while in an "off" condition. The instructions 726 or data in use by a user or the machine 700 are typically loaded in the main memory 704 for use by the processing device 702. When the main memory 704 is full, virtual space from the data storage device 718 can be allocated to supplement the main memory 704; however, because the data storage device 718 device is typically slower than the main memory 704, and write speeds are typically at least twice as slow as read speeds, use of virtual memory can greatly reduce user experience due to storage device latency (in contrast to the main memory 704, e.g., DRAM). Further, use of the data storage device 718 for virtual memory can greatly reduce the usable lifespan of the data storage device 718.

In contrast to virtual memory, virtual memory compression (e.g., the Linux™ kernel feature "ZRAM") uses part of the memory as compressed block storage to avoid paging to the data storage device 718. Paging takes place in the compressed block until it is necessary to write such data to the data storage device 718. Virtual memory compression increases the usable size of the main memory 704, while reducing wear on the data storage device 718.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host (e.g., a host device), and are often removable and separate components from the host. In contrast, eMMC™ devices are attached to a circuit board and considered a component of the host, with read speeds that rival serial ATA™ (Serial AT (Advanced Technology) Attachment, or SATA) based SSD devices. However, demand for mobile device performance continues to increase, such as to fully enable virtual or augmented-reality devices, utilize increasing networks speeds, etc. In response to this demand, storage devices have shifted from parallel to serial communication interfaces. Universal Flash Storage (UFS) devices, including controllers and firmware, communicate with a host using a low-voltage differential signaling (LVDS) serial interface with dedicated read/write paths, further advancing greater read/write speeds.

The instructions 724 may further be transmitted or received over a network 720 using a transmission medium via the network interface device 708 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 708 may include one or more physical jacks (e.g., Ethernet, coaxial, or phone jacks) or one or more antennas to connect to the network 720. In an example, the network interface device 708 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 700, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, unless stated otherwise the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or mufti-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

ADDITIONAL DESCRIPTION AND EXAMPLES

Example 1 includes subject matter (such as a memory device) comprising a memory array including memory cells; a temperature sensing circuit; and a memory control unit operatively coupled to the memory array and including a processor. The processor is configured to receive temperature information from the temperature sensing circuit; initiate programming of the memory cells with data using a first threshold voltage distribution when the temperature information indicates a first temperature range; and initiate programming of the memory cells with data using a second threshold voltage distribution when the temperature information indicates a second temperature range.

In Example 2, the subject matter of Example 1 optionally includes the first temperature range being a medium temperature range and the second temperature range including a high temperature range with temperatures higher than the medium temperature range and a low temperature range with temperatures lower than the medium temperature range. The subject matter optionally includes a processor configured to: initiate programming of the memory cells with data using the first threshold voltage distribution when the temperature information indicates an operating temperature in the medium temperature range; initiate programming of the memory cells with data using the second threshold voltage distribution when the temperature information indicates an operating temperature in the high temperature range; and initiate programming of the memory cells with data using the second threshold voltage distribution or a third threshold voltage distribution when the temperature information indicates an operating temperature in the low temperature range.

In Example 3, the subject matter of one or both of Examples 1 and 2 optionally include a processor configured to initiate programming the memory cells to a first number of threshold voltages (Vts) using a programming algorithm that includes a first number of voltage steps when the temperature information indicates an operating temperature in the first temperature range; and initiate programming the memory cells to the first number of Vts using a programming algorithm with a second increased number of voltage steps when the temperature information indicates an operating temperature in the second temperature range, wherein one or more of the second number of voltage steps is unused in the programming.

In Example 4, the subject matter of one or any combination of Examples 1-3 optionally includes a digital to analog converter (DAC) circuit configured to program a threshold voltage of one or more memory cells; and a configured to initiate programming the one or more memory cells using an increased number of DAC steps when the temperature information indicates the operating temperature is in the second temperature range than when the temperature information indicates the first temperature range.

In Example 5, the subject matter of Example 4 optionally includes a processor configured to initiate programming the one or more memory cells using a step size of the DAC circuit that is smaller when the temperature information indicates the operating temperature is in the second temperature range than when the temperature information indicates the operating temperature is in the first temperature range.

In Example 6, the subject matter of one or any combination of Examples 1-5 optionally includes a processor configured to initiate programming the memory cells using an increased number of program pulses when the temperature information indicates the operating temperature is in the second temperature range than when the temperature information indicates the operating temperature is in the first temperature range.

In Example 7, the subject matter of one or any combination of Examples 1-6 optionally includes a processor configured to initiate programming of the memory cells with increased margins between threshold voltages than the first threshold voltage distribution when programming using the second threshold voltage distribution.

Example 8 includes subject matter (such as a method comprising act to control operation of a data communications device, or a computer readable storage medium including instructions that, when performed by processing circuitry of a computing device, cause the computing device to perform the acts), or can optionally be combined with any of Aspects 1-7 to include such subject matter, comprising receiving an indication of a write operation to program memory cells of a memory array of the memory device with data, receiving temperature information at the memory device, and programming memory cells of the memory array with data using a first threshold voltage distribution when the temperature information indicates an operating temperature in a first temperature range and programming the memory cells of the memory array with data using a second threshold voltage distribution when the temperature information indicates an operating temperature in a second temperature range.

In Example 9, the subject matter of Example 8 optionally includes determining whether the temperature information indicates that an operating temperature of the memory array is within a high temperature range, medium temperature range or a low temperature range, and programming the memory cells with data using the first threshold voltage distribution when the operating temperature is within the medium temperature range, using the second threshold voltage distribution when the operating temperature is in the high temperature range, and using the second threshold voltage distribution or a third threshold voltage distribution when the operating temperature is in the low temperature range.

In Example 10, the subject matter of one or both of Examples 8 and 9 optionally includes programming the memory cells to a first number of threshold voltages (Vts) using a programming algorithm that includes a first number of voltage steps when the temperature information indicates the operating temperature is in the first temperature range, and programming the memory cells to the first number of Vts using a programming algorithm with a second increased number of voltage steps when the temperature information indicates the operating temperature is in the second temperature range, wherein one or more of the second number of voltage steps is unused in the programming.

In Example 11, the subject matter of one or any combination of Examples 8-10 optionally includes programming the memory cells for the first and the second voltage distributions using a digital to analog converter (DAC) circuit; and increasing the number of DAC steps used to program the memory cells when the temperature information indicates the operating temperature is in the second temperature range.

In Example 12, the subject matter of one or any combination of Examples 8-11 optionally includes, for the second threshold voltage distribution, programming the memory cells includes decreasing a step size of the DAC circuit when the temperature information indicates the operating temperature is in the second temperature range.

In Example 13, the subject matter of one or any combination of Examples 8-12 optionally includes, for the second threshold voltage distribution, increasing the number of program pulses used to program the memory cells from the number used to program the first threshold voltage distribution.

In Example 14, the subject matter of one or any combination of Examples 8-13 optionally includes, for the second threshold voltage distribution, programming the memory cells to have increased margins between threshold voltages than the first threshold voltage distribution.

Example 15 can include subject matter (or can optionally be combined with one or any combination of Examples 1-14 to include such subject matter), such as a computer readable storage medium comprising instructions configured to cause a memory control unit of a memory device to perform acts including: receive an indication of a write operation to program memory cells of a memory array of the memory device with data; receive temperature information at the memory device; and memory cells of the memory array with data using a first threshold voltage distribution when the temperature information indicates an operating temperature in a first temperature range and program the memory cells of the memory array with data using a second threshold voltage distribution when the temperature information indicates an operating temperature in a second temperature range.

In Example 16, the subject matter of Example 15 optionally includes instructions configured to cause the memory control unit to determine whether the temperature information indicates that an operating temperature of the memory array is within a high temperature range, medium temperature range or a low temperature range, and initiate programming the memory cells of the memory array with the data using the first threshold voltage distribution when the operating temperature is within the medium temperature range, using the second threshold voltage distribution when the operating temperature is within the high temperature range, and using the second threshold voltage distribution or a third threshold voltage distribution when the operating temperature is within the low temperature range.

In Example 17, the subject matter of one or both of Examples 15 and 16 optionally includes instructions configured to cause the memory control unit to program the memory cells to a first number of threshold voltages (Vts) using a programming algorithm that includes a first number of voltage steps when the temperature information indicates an operating temperature in the first temperature range; and program the memory cells to the first number of Vts using a programming algorithm with a second increased number of voltage steps when the temperature information indicates an operating temperature in the second temperature range, wherein one or more of the second number of voltage steps is unused in the programming.

In Example 18, the subject matter of one or any combination of Examples 15-17 optionally includes instructions configured to cause the memory control unit to initiate programming the memory cells of the memory array for the first and the second voltage distributions using a digital to analog converter (DAC) circuit, increase a number of DAC steps used to program the memory cells when the temperature information indicates the operating temperature is in the second temperature range than when the temperature information indicates the operating temperature is in the first temperature range.

In Example 19, the subject matter of one or any combination of Examples 15-18 optionally includes instructions configured to cause the memory control unit increase the number of program pulses used to program the memory cells when the temperature information indicates the operating temperature is in the second temperature range than when the temperature information indicates the operating temperature is in the first temperature range.

In Example 20, the subject matter of one or any combination of Examples 15-19 optionally includes instructions configured to cause the memory control unit to initiate programming the memory cells using an increased voltage margin for the second threshold voltage distribution than when programming the first threshold voltage distribution.

These non-limiting examples can be combined in any permutation or combination. The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A memory device comprising:
a memory array including memory cells;
a temperature sensing circuit; and
a memory control unit operatively coupled to the memory array and including a processor, the processor configured to:
initiate programming of the memory cells with data using a first programming algorithm to implement a first threshold voltage distribution in response to the temperature sensing circuit indicating an operating temperature in a first temperature range; and
initiate programming of the memory cells with data using a second programming algorithm to implement a second threshold voltage distribution in response to the temperature sensing circuit indicating an operating temperature in a second temperature range, wherein the second programming algorithm has a smaller change in threshold voltage between available programming steps and one or more of the available programming steps is unused in the programming.

2. The memory device of claim 1, wherein the first and second voltage threshold distributions are over a same threshold voltage range and the second programming algorithm includes more available programming steps than the first programming algorithm over the same threshold voltage range, and the second programming algorithm omits one or more of the available programming steps.

3. The memory device of claim 1, wherein the first and second voltage threshold distributions are over a same threshold voltage range and the second programming algorithm has a finer trim in programmable threshold voltage than the first programming algorithm.

4. The memory device of claim 1, including:
a digital to analog converter (DAC) circuit configured to program a threshold voltage of one or more memory cells; and
wherein the second programming algorithm uses a smaller threshold voltage change between DAC steps than the first programming algorithm, and the second programming algorithm omits one or more the DAC steps.

5. The memory device of claim 4, wherein the first and second voltage threshold distributions are over a same threshold voltage range and the first and second programming algorithms program a same number of programmed threshold voltages over the threshold voltage range.

6. The memory device of claim 1,
wherein the first temperature range is a medium temperature range and the second temperature range includes a high temperature range with temperatures higher than the medium temperature range; and
wherein the processor is configured to:
initiate programming of the memory cells with data using the first programming algorithm when the temperature sensing circuit indicates an operating temperature in the medium temperature range;
initiate programming of the memory cells with data using the second programming algorithm when the temperature sensing circuit indicates an operating temperature in the high temperature range; and
initiate programming of the memory cells with data using the second programming algorithm or a third programming algorithm to implement a third threshold voltage distribution when the temperature sensing circuit indicates an operating temperature in a low temperature range with temperatures lower than the medium temperature range.

7. The memory device of claim 1, wherein the second programming algorithm uses more programming pulses to program a memory cell than the first programming algorithm.

8. The memory device of claim 1, wherein the second threshold voltage distribution includes increased margins between threshold voltages than the first threshold voltage distribution.

9. A method of operating a memory device, the method comprising:
receiving an indication of a write operation to program memory cells of a memory array of the memory device with data;
receiving temperature information at the memory device;
programming the memory cells with data using a first programming algorithm to implement a first threshold voltage distribution in response to the temperature information indicating an operating temperature in a first temperature range; and
programming the memory cells with data using a second programming algorithm to implement a second threshold voltage distribution in response to the temperature information indicating an operating temperature in a second temperature range, wherein the second programming algorithm has a smaller change in threshold voltage between available programming steps and one or more of the available programming steps is unused in the programming.

10. The method of claim 9, including:
using one of the first and second programming algorithms to program first and second voltage threshold distributions over a same threshold voltage range according to the temperature information, wherein the second programming algorithm includes more available programming steps than the first programming algorithm over the same threshold voltage range; and
omitting one or more of the available programming steps of the second programming algorithm when programming the memory cells with data using the second programming algorithm.

11. The method of claim 9, including using one of the first and second programming algorithms to program first and second voltage threshold distributions over a same threshold voltage range according to the temperature information, wherein the second programming algorithm has a finer trim in programmable threshold voltage than the first programming algorithm.

12. The method of claim 9, including:
programing a threshold voltage of one or more memory cells using a digital to analog converter (DAC) circuit;
using a smaller threshold voltage change between DAC steps when programming memory cells using the second programming algorithm than when using the first programming algorithm; and omitting one or more of the DAC steps of the second programming algorithm in response to the temperature information indicating the operating temperature in the second temperature range.

13. The method of claim 12, including programming a same number of threshold voltages over a same threshold voltage range when programming using either the first programming algorithm or the second programming algorithm.

14. The method of claim 9,
wherein the programming using the first programming algorithm includes programming the memory cells using the first programming algorithm in response to the temperature information indicating that the operating temperature is in a medium temperature range;
wherein the programming using the second programming algorithm includes programming the memory cells using the second programming algorithm in response to the temperature information indicating that the operating temperature is in a high temperature range with temperatures higher than the medium temperature range; and
wherein the method further includes programming of the memory cells using a third programming algorithm to implement a third threshold voltage distribution when the temperature information indicates an operating temperature in a low temperature range with temperatures lower than the medium temperature range.

15. The method of claim 9, including using more programming pulses to program a memory cell in response to the temperature information indicating the operating temperature is in the second temperature range.

16. The method of claim 9, wherein programming the memory cells using the second programming algorithm includes programming the memory cells with a second threshold voltage distribution having increased margins between threshold voltages than the first threshold voltage distribution.

17. A non-transitory computer readable storage medium comprising instructions configured to cause a memory control unit of a memory device to:
receive an indication of a write operation to program memory cells of a memory array of the memory device with data;
receive temperature information at the memory device;
program the memory cells with data using a first programming algorithm to implement a first threshold voltage distribution in response to the temperature information indicating an operating temperature in a first temperature range; and
program the memory cells with data using a second programming algorithm to implement a second threshold voltage distribution in response to the temperature information indicating an operating temperature in a second temperature range, wherein the second programming algorithm has a smaller change in threshold voltage between available programming steps and one or more of the available programming steps is unused in the programming.

18. The non-transitory computer readable storage medium of claim 17, including instructions configured to cause the memory control unit to:
use one of the first and second programming algorithms to program first and second voltage threshold distributions over a same threshold voltage range according to the temperature information, wherein the second programming algorithm includes more available programming steps than the first programming algorithm over the same threshold voltage range; and
omit one or more of the available programming steps of the second programming algorithm when programming the memory cells with data using the second programming algorithm.

19. The non-transitory computer readable storage medium of claim 17, including instructions configured to cause the memory control unit to:
program a threshold voltage of one or more memory cells using a digital to analog converter (DAC) circuit;
use a smaller threshold voltage change between DAC steps when programming memory cells using the second programming algorithm than when using the first programming algorithm; and
omit one or more of the DAC steps of the second programming algorithm in response to the temperature information indicating the operating temperature in the second temperature range.

20. The non-transitory computer readable storage medium of claim 17, including instructions configured to cause the memory control unit to:
program the memory cells using the first programming algorithm in response to the temperature information indicating that the operating temperature is in a medium temperature range;
program the memory cells using the second programming algorithm in response to the temperature information indicating that the operating temperature is in a high temperature range with temperatures higher than the medium temperature range; and
program of the memory cells using a third programming algorithm to implement a third threshold voltage distribution when the temperature information indicates an operating temperature in a low temperature range with temperatures lower than the medium temperature range.

* * * * *